United States Patent
Kim

(12) 
(10) Patent No.: US 6,812,743 B2
(45) Date of Patent: Nov. 2, 2004

(54) INPUT BUFFER OF DIFFERENTIAL AMPLIFICATION TYPE IN SEMICONDUCTOR DEVICE

(75) Inventor: Yong-Ki Kim, Kyoungki-do (KR)

(73) Assignee: Hynix Semiconductor Inc., Kyoungki-Do (KR)

( * ) Notice: Subject to any disclaimer, the term of this patent is extended or adjusted under 35 U.S.C. 154(b) by 0 days.

(21) Appl. No.: 10/328,796

(22) Filed: Dec. 24, 2002

(65) Prior Publication Data

US 2004/0051557 A1 Mar. 18, 2004

(51) Int. Cl.[7] ............................................. H03K 19/175
(52) U.S. Cl. ........................................ 326/83; 326/86
(58) Field of Search ............................. 326/80, 81, 82, 326/83, 86

(56) References Cited

U.S. PATENT DOCUMENTS

| | | | |
|---|---|---|---|
| 5,013,941 A | | 5/1991 | Jansson |
| 5,361,002 A | | 11/1994 | Casper |
| 5,528,172 A | * | 6/1996 | Sundstrom .................... 326/80 |
| 6,108,737 A | | 8/2000 | Sharma et al. |
| 6,147,513 A | | 11/2000 | Bui |
| 6,147,522 A | * | 11/2000 | Rhode et al. ................. 327/93 |
| 6,448,809 B2 | * | 9/2002 | Goetting et al. .............. 326/44 |
| 6,696,897 B1 | * | 2/2004 | Kong et al. ................... 331/45 |

FOREIGN PATENT DOCUMENTS

| | | |
|---|---|---|
| JP | 03-252570 | 11/1991 |
| JP | 04-037218 | 2/1992 |
| JP | 06-203474 | 7/1994 |
| JP | 09-180460 | 7/1997 |
| JP | 11-134864 | 5/1999 |
| JP | 11-273341 | 10/1999 |

* cited by examiner

*Primary Examiner*—Don Le
(74) *Attorney, Agent, or Firm*—Marshall, Gerstein & Borun LLP

(57) ABSTRACT

In a semiconductor device, an input buffer for buffering an input signal to provide an internal signal includes a reference voltage adjusting unit configured to receive a reference voltage and to output a first reference signal having a potential level higher than that of the reference voltage and a second reference signal having a potential level lower than that of the reference voltage, a multiplexing unit configured to selectively output one of the first and second reference signals as a newly selected reference signal in response to the internal signal, a differential amplification unit configured to amplify the input signal by comparing the input signal with the newly selected reference signal outputted to generate an amplified input signal, and an internal buffer configured to output the internal signal by buffering the amplified input signal.

17 Claims, 4 Drawing Sheets

INPUT BUFFER OF DIFFERENTIAL AMPLIFICATION TYPE IN SEMICONDUCTOR DEVICE

TECHNICAL FIELD

The present disclosure relates to a semiconductor memory device, and more particularly, to an input buffer having a differential amplifier in the semiconductor memory device.

BACKGROUND

A semiconductor device is fabricated by semiconductor technologies such as a silicon wafer forming technology, and a logic design technology and so on. A final product through a semiconductor fabricating process is a chip of a plastic package type. The chip may be fabricated with different logics and functions according to a purpose for use thereof. Most of important semiconductor chips configuring an application system are assembled to a printed circuit board (PCB) and several driving voltages for driving the chips are supplied thereto.

All semiconductor devices including semiconductor memory operate according to input/output signals having specific purposes. Namely, operations of the semiconductor device are carried out in response to a combination signal of input/output signals. An output signal of a certain semiconductor device may be used as an input signal of another semiconductor device in the same system.

An input buffer is a part buffering a signal applied from an external circuit and providing the buffered signal into the semiconductor device and there is a static input buffer as the simplest type. The static input buffer consists of a PMOS transistor and an NMOS transistor connected in series between a power supply voltage and a ground voltage. The static input buffer has an advantage that the configuration is very simple, however, tolerance against a noise is weak, and, an input signal having large amplitude is required. Namely, the large amplitude between a logic high level and a logic low level of the input signal is required. Therefore, the static input buffer is not proper to be applied to a device, which the amplitude of input signals is small or a high operation frequency is required. Accordingly, an input buffer of a differential amplification type, which has a high tolerance against a noise and is easy to be applied to a high frequency, is suggested.

FIG. 1 is a schematic diagram illustrating a conventional input buffer of a differential amplification type. In particular, the input buffer 100 of the differential amplification type includes a differential amplification unit 11 and an internal buffer 12. The differential amplification unit 11 compares an input signal applied to a positive terminal (+) thereof with a reference voltage signal applied to a negative terminal (−) thereof. The internal buffer 12 buffers an output from the differential amplification unit 11 and issues an internal signal INT.

FIG. 2 is a circuit diagram illustrating the differential amplification unit 11 in FIG. 1. As shown, the differential amplification unit 11 includes a differential amplifier 11A and an inverter 11B. The differential amplifier 11A includes a first NMOS transistor MN1, a second NMOS transistor MN2, a first PMOS transistor MP1, and a second PMOS transistor MP2 to form a current mirror. The reference voltage Vref is applied to a gate of the first NMOS transistor MN1, and the input signal IN is applied to a gate of the second NMOS transistor MN2. The differential amplifier 11A further includes a third NMOS transistor MN3, which is coupled between ground and the first and second transistors MN1 and MN2. A buffer enable signal is applied to the gate of the transistor MN3 for a bias. Third and fourth PMOS transistors MP3 and MP4 forming a current mirror are coupled to the first and second transistors MP1 and MP2, respectively, in parallel. The buffer enable signal buffer_en is applied to the gates of the third and fourth PMOS transistors MP3 and MP4.

The inverter 11B includes a pull-up PMOS transistor MP5 and a pull-down NMOS transistor MN4. An output signal of the differential amplifier 11A is commonly applied to the gates of the pull-up PMOS transistor MP5 and a pull-down transistor MN4.

FIG. 3 is a circuit diagram illustrating the internal buffer 12 in FIG. 1. The internal buffer 12 includes a first inverter INV1 and a second inverter INV2 coupled in series. The number of the inverters in the internal buffer 12 may be adjusted.

For example, an operation of the input buffer of the differential amplification type will be described by referring to FIGS. 2 and 3. When the input signal IN is applied to an input terminal of the differential amplifier 11A, the differential amplifier 11A will be operated according to states whether the voltage level of the input signal IN is higher or lower than that of the reference voltage signal Vref because since the voltage of the input signal IN is higher or lower than the reference voltage signal Vref. The reference voltage signal Vref is a static voltage, which always maintains a constant voltage level. The reference voltage signal Vref may be provided through a specific input pin from an external circuit or may be generated in the semiconductor device.

A constant current I1 flows at the first NMOS transistor MN1 receiving the reference voltage signal Vref. A current flowing at the second NMOS transistor MN2, which is symmetrically configured with the first NMOS transistor MN1, is determined by the voltage level of the input signal IN. In particular, the differential amplifier 11A determines a voltage level of an output node N1 according to a comparison result between the currents I1 and I2.

If the current I2 is relatively higher than the current I1, the voltage level of the output node N1 decreases. Finally, a signal of a logic high level is outputted via the inverter 11B. In this case, the input buffer 100 issues a signal of a logic high level. On the other hand, if the current I2 is relatively lower than the current I1, an output of the inverter 11B becomes a signal having a logic low level. In this case, the input buffer issues a signal of a logic low level. The buffer enable signal buffer_en is disabled to a logic low level at a power-down mode or a self-refresh mode so that the input buffer is inactivated to a precharge state and, in other modes, the buffer enable signal buffer_en is adjusted to a logic high level so that the input buffer is activated.

The input buffer 100 basically plays a role of an interface for transmitting signals between an internal circuit and an external circuit of a semiconductor device. Therefore, an input buffer configured to rapidly transmit signal variation at an input terminal is required. The semiconductor device performing an amplification operation with high gain is suggested to rapidly transmit signals.

Because the reference voltage signal Vref having a constant potential level is always supplied to the gate of the first NMOS transistor MN1 in the input buffer 100 of the differential amplification type illustrated in FIGS. 1 to 3, the current I1 flowing at the first NMOS transistor MN1 is fixed. Therefore, high amplitude of the input signal IN is required for a rapid operation. Generally, however, small amplitude of an input signal is required to improve signal integration and rapidly vary a voltage level of a signal in a system operated with a high speed.

SUMMARY OF THE DISCLOSURE

An input buffer of a differential amplification type and a method for improving a signal transmission speed without increase of amplitude of an input signal are described herein. An input buffer for buffering an input signal to provide an internal signal in a semiconductor device includes: a reference voltage adjusting unit configured to receive a reference voltage and to output a first reference signal having a potential level higher than that of the reference voltage and a second reference signal having a potential level lower than that of the reference voltage; a multiplexing unit configured to selectively output one of the first and second reference signals as a newly selected reference signal in response to the internal signal; a differential amplification unit configured to amplify the input signal by comparing the input signal with the newly selected reference signal outputted to generate an amplified input signal; and an internal buffer configured to output the internal signal by buffering the amplified input signal.

Alternatively, an input buffer of a differential amplification type for buffering an input signal to provide an internal signal in a semiconductor device includes: a multiplexing unit configured to selectively output a first reference signal having a higher potential level than that of a reference voltage or a second reference signal having a lower potential level than that of the reference voltage in response to the internal signal; a differential amplification unit configured to amplify an input signal by comparing the reference signal selectively outputted from the multiplexing means with the input signal; and an internal buffer configured to output the internal signal by buffering the amplified input buffer.

Further, a method for outputting an internal signal in an input buffer of a differential amplification type for use in a semiconductor device comprises the steps of: selectively outputting a first reference signal having a potential level higher than that of a reference voltage or a second reference signal having a potential level higher than that of the reference voltage in response to the internal signal; amplifying an input signal by detecting a phase of the input signal by comparing the input signal with the selectively outputted reference signal; and buffering and outputting a amplified signal.

BRIEF DESCRIPTION OF THE DRAWINGS

The disclosure will be described in terms of several embodiments to illustrate its broad teachings. Reference is also made to the attached drawings.

DETAILED DESCRIPTION

The present disclosure will be described in detail with reference to the accompanying drawings. In particular, an input buffer of a semiconductor memory device capable of improving a signal transmission speed without increase of voltage level variation for an input signal is described herein.

Figure 1:
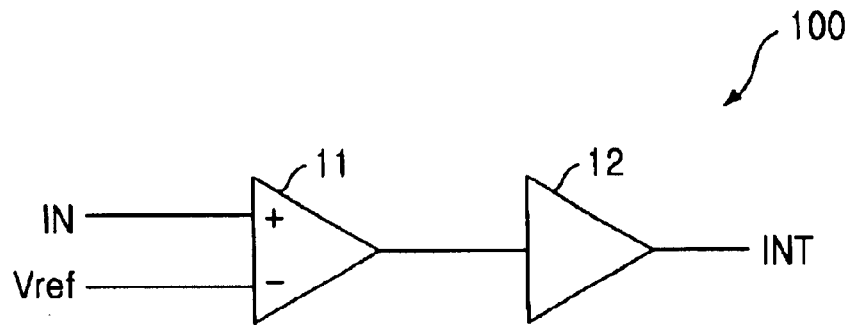
FIG. 1 is a schematic diagram illustrating a conventional input buffer of a differential amplification type.
Figure 2:
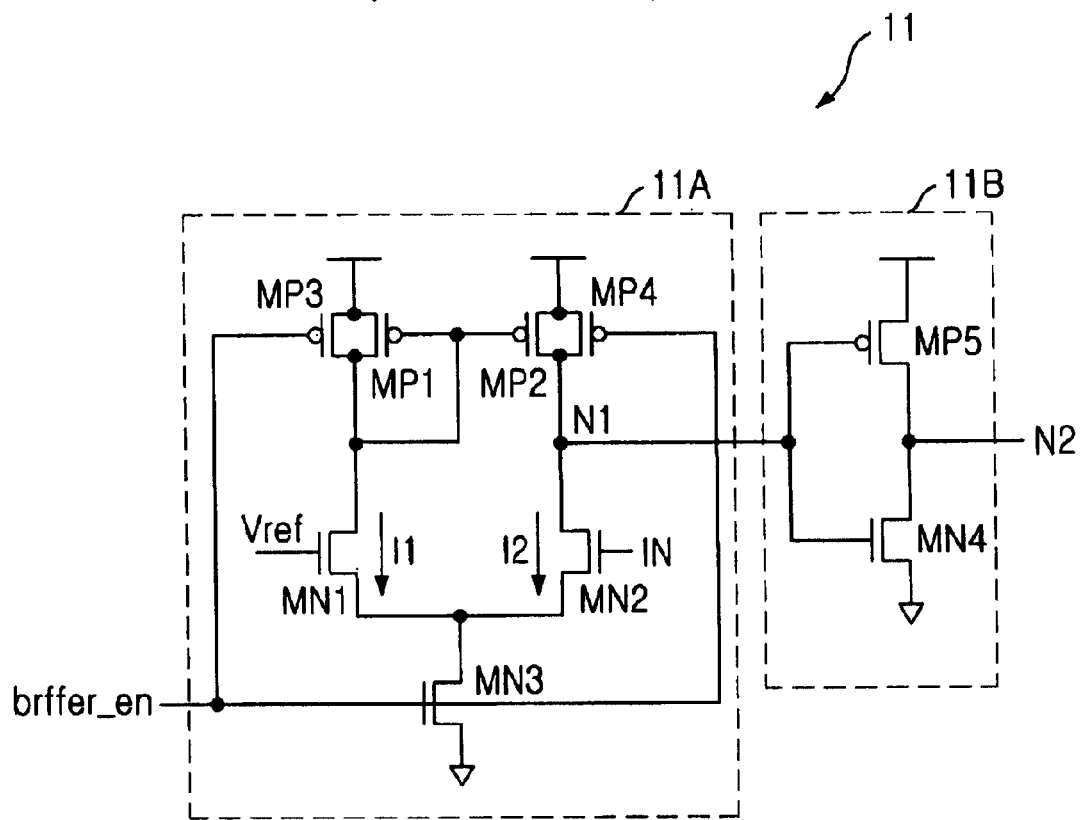
FIG. 2 is a circuit diagram illustrating the differential amplification unit 11 in FIG. 1.
Figure 3:
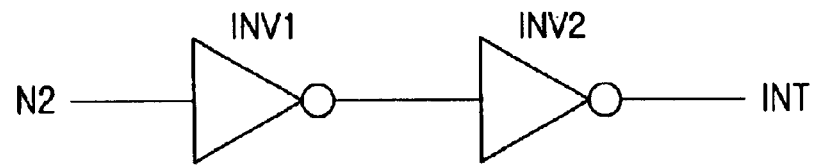
FIG. 3 is a circuit diagram illustrating the internal buffer 12 in FIG. 1.
Figure 4:
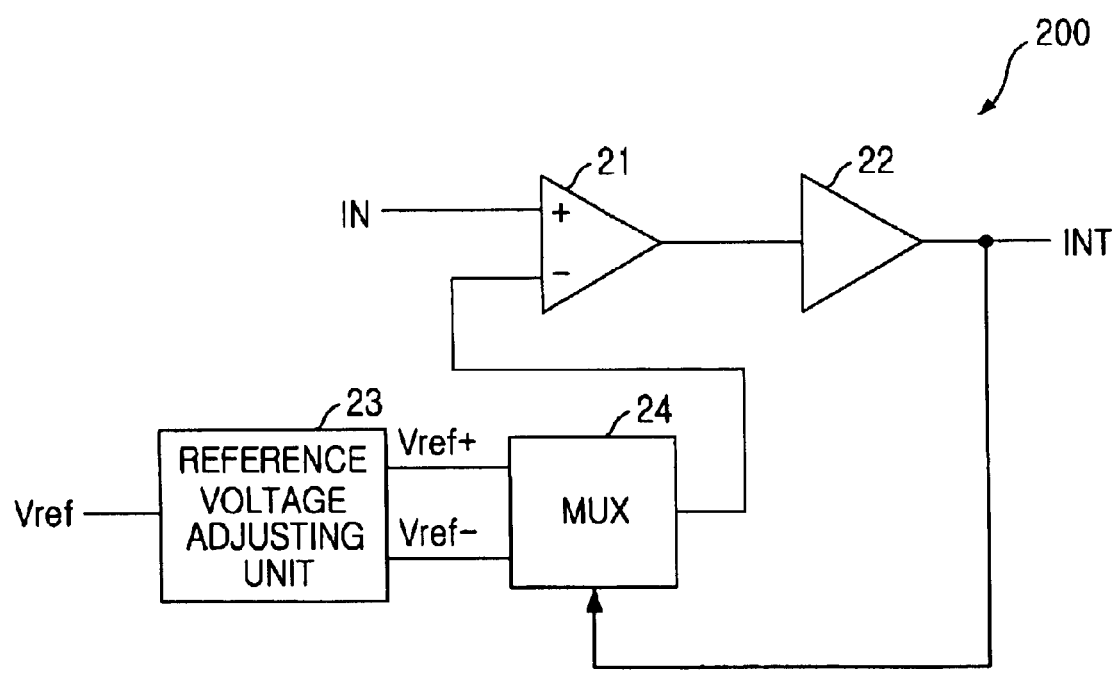
FIG. 4 is a block diagram illustrating an input buffer of a differential amplification type.

Referring to FIG. 4, the input buffer 200 includes a differential amplification unit 21, an internal buffer 22, a reference voltage adjusting unit 23 and a multiplexer 24. The reference voltage adjusting unit 23 receives a reference voltage signal Vref and generates a first reference voltage signal Vref+ and a second reference voltage signal Vref−. The first reference voltage signal Vref+ has a higher voltage level than that of the reference voltage Vref whereas the second reference voltage signal Vref− has a lower voltage level than that of the reference voltage Vref.

The multiplexer 24 selectively outputs the first reference signal Vref+ or the second reference signal Vref− in response to an internal signal INT, which is an output signal of the input buffer 22. The selectively outputted first or second reference signal Vref+ or Vref− is applied to the negative terminal (−) of the differential amplification unit 21, and an input signal IN is applied to a positive terminal (+) of the differential amplification unit 23.

When the input signal IN of a logic high level is supplied to the input buffer 200, outputs of the differential amplification unit 21 and the internal buffer 22 become a signal of a logic high level. The internal signal INT is the output of the internal buffer 22, which is used as a selection signal of the multiplexer 24.

If the output signal of the internal buffer 22 having a logic high voltage level is applied to the multiplexer 24, the multiplexer 24 outputs the first reference voltage signal Vref+ from the outputs of the reference voltage adjusting unit 23. On the other hand, if the output signal of the internal buffer 22 having a logic low voltage level is applied to the multiplexer 24, the second reference voltage signal Vref− is outputted.

A voltage level of the input signal IN applied to the positive terminal (+) of the differential amplification unit 21 may become an opposite voltage level. If the reference voltage signal is adjusted in advance, the voltage level difference between the input signal and the reference signal (Vref+ or Vref−) is increased when the voltage level of the input signal IN is adjusted to an opposite voltage level and then applied to the positive terminal (+) of the differential amplification unit 21 so that a voltage level of the output signal of the input buffer may be rapidly adjusted to the opposite voltage level. If the input signal of a logic high level is applied to the differential amplification unit 21, the first reference signal Vref+ is selected as the reference signal. Therefore, if the voltage level of the input signal is adjusted to a logic low voltage level, the difference between the first reference signal Vref+ and the input signal increases.

Figure 5:
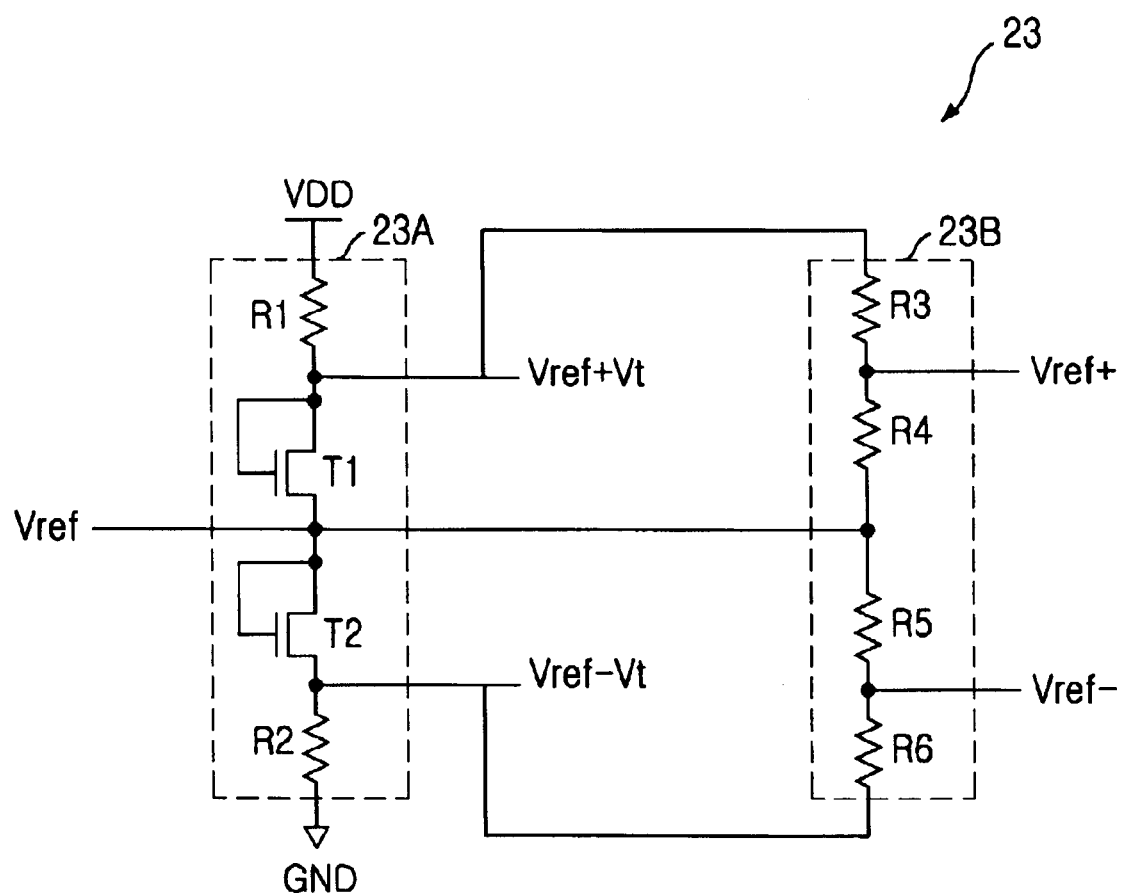
FIG. 5 is a circuit diagram illustrating the reference voltage adjusting unit 23 in FIG. 4.

Referring to FIG. 5, the reference voltage adjusting unit 23 includes a first reference voltage adjusting unit 23A and a second reference voltage adjusting unit 23B. The first reference voltage adjusting unit 23A includes a first resistance R1, a first NMOS transistor T1, a second NMOS transistor T2, and a second resistance R2 connected in series between a power supply voltage VDD and a ground GND. Two NMOS transistors T1 and T2 are diode-coupled, and the reference voltage Vref is applied to a junction of the two NMOS transistors T1 and T2. Two resistances R1 and R2 are used for a current source flowing through the first and second NMOS transistors T1 and T2. A first voltage Vref+ Vt, which is higher than the reference voltage Vref by a threshold voltage Vt of the first NMOS transistor T1, is outputted from a junction of the first resistance R1 and the first NMOS transistor T1. A second voltage Vref−Vt, which is lower than the reference voltage Vref by a threshold voltage Vt of the second NMOS transistor T2, is outputted from a junction of the second NMOS transistor T2 and the second resistance R2.

The second reference voltage adjusting unit 23B includes third and fourth resistances R3 and R4 coupled in series between the first voltage Vref+Vt and the reference voltage Vref, and fifth and sixth resistances R5 and R6 coupled in series between the reference voltage Vref and the second voltage Vref−Vt. The third and fourth resistances R3 and R4 may operate as a voltage divider. The first reference signal, which is outputted from a node between the third and fourth resistances R3 and R4, is determined by the following equation.

$$Vref+ = Vref + [(Vref+Vt) - Vref] * R4/(R3+R4) \rightarrow \quad (1)$$

The fifth and sixth resistances R5 and R6 are also operated as a voltage divider. The second reference signal Vref−, which is outputted from a junction of the fifth and sixth resistances R5 and R6, is determined by the following equation.

$$Vref- = (Vref-Vt) + [Vref - (Vref-Vt)] * R6/(R5+R6) \rightarrow \quad (2)$$

Referring to the above equations (1) and (2), the levels of the first and second reference signals Vref+ and Vref− are determined by a predetermined resistance ratio. If a resistance value of the third resistance R3 is identical to that of the fourth resistance R4, the equation (1) becomes the following equation.

$$Vref+ = Vref + Vt/2 \rightarrow \quad (3)$$

Further, if a resistance value of the fifth resistance R5 is identical to that of the sixth R6, the equation (2) becomes the following equation.

$$Vref- = (Vref-Vt) + Vt/2 \quad (4)$$

Even if there is a plurality of input buffers in one semiconductor device, it is not necessary to set the reference voltage adjusting unit 23 per each input buffer. That is, one reference voltage adjusting unit 23 may be configured to one semiconductor device. On the other hand, the number of the multiplexer 24 is determined according to the number of the input buffers.

Figure 6:
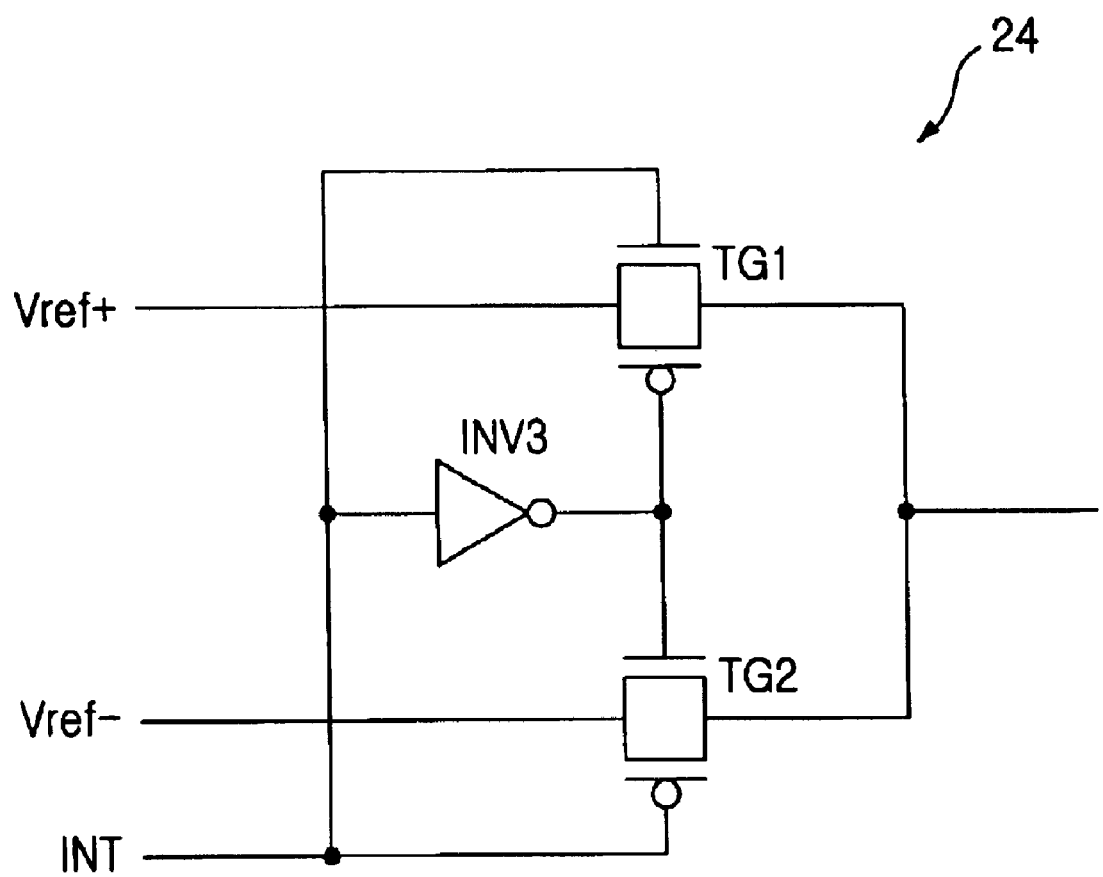
FIG. 6 is a circuit diagram illustrating the multiplexer 24 in FIG. 4.

As shown in FIG. 6, the multiplexer 24 includes a first transmission gate TG1 configured to output the first reference signal Vref+ in response to the internal signal INT, a second transmission gate TG2 configured to output the second reference signal Vref− in response to the internal signal INT, and a third inverter INV3 configured to generate an inverted signal of the internal signal INT. Herein, the first and second transmission gates TG1 and TG2 are configured with an opposite type so that one of reference voltage signals Vref+ and Vref− is selectively outputted.

If the internal signal INT is a logic low level, the second transmission gate TG2 is turned on and the first transmission gate TG1 is turned off so that the second reference signal Vref− having a voltage level lower than that of the reference voltage Vref is outputted. On the contrary, if the internal signal INT is a logic high level, the first transmission gate TG1 is turned on and the second transmission gate TG2 is turned off so that the first reference signal Vref+ having a voltage level higher than that of the reference voltage Vref is outputted. Even if the differential amplifier of an NMOS bias type is used, a differential amplifier of a PMOS bias type may be applied.

To generate the reference voltages Vref+ and Vref−, an example is introduced according to the equations (1) and (2). However, any reference voltage adjusting unit configured to generate the reference voltage signals, which have a higher or lower voltage level than that of the reference voltage Vref, may be applied to the input buffer 200.

Accordingly, when the input signal of a logic high level is applied to the input buffer, the first reference voltage signal Vref+ is selected by the internal signal as the reference voltage of the differential amplifier. Therefore, when the voltage level of the input signal is adjusted to a logic low level because the voltage level difference between the input signal and the first reference voltage signal Vref+ is high, a signal transmission speed effectively is improved in the input buffer so that the input buffer may be applied to the high frequency operation of the semiconductor device.

Many changes and modifications to the embodiments described herein could be made. The scope of some changes is discussed above. The scope of others will become apparent from the appended claims.

What is claimed is:

1. An input buffer for buffering an input signal to provide an internal signal in a semiconductor device, the input buffer comprising:
    a reference voltage adjusting unit configured to receive a reference voltage and to output a first reference signal having a potential level higher than that of the reference voltage and a second reference signal having a potential level lower than that of the reference voltage;
    a multiplexing unit configured to selectively output one of the first and second reference signals as a newly selected reference signal in response to the internal signal;
    a differential amplification unit configured to amplify the input signal by comparing the input signal with the newly selected reference signal outputted to generate an amplified input signal; and
    an internal buffer configured to output the internal signal by buffering the amplified input signal.

2. The input buffer as recited in claim 1, wherein the multiplexing unit outputs the first reference signal when the internal is a logic high level.

3. The input buffer as recited in claim 1, wherein the multiplexing unit outputs the first reference signal when the internal is a logic low level.

4. The input buffer as recited in claim 1, wherein the reference voltage adjusting unit includes:
    a first reference voltage adjusting unit configured to generate a first signal having a potential level higher than that of the reference voltage by a predetermined potential level, and a second signal having a potential level lower than that of the reference voltage by a predetermined potential level; and
    a second reference voltage adjusting unit configured to generate the first and second reference signals by dividing the reference voltage and an output of the first reference signal.

5. The input buffer as recited in claim 4, wherein the first reference voltage adjusting unit includes:
    a first resistance and a first diode-coupled MOS transistor coupled in series between a power supply voltage and the reference voltage; and
    a second diode-coupled MOS transistor and a second resistance coupled in series between the reference voltage and a ground voltage.

6. The input buffer as recited in claim 5, wherein the second reference voltage adjusting unit includes:
- a third resistance and a fourth resistance coupled in series between the reference voltage and a junction of the first resistance and the first diode-coupled MOS transistor; and
- a fifth resistance and a sixth resistance coupled in series between the ground and a junction of the second diode-coupled MOS transistor and the second resistance.

7. The input buffer as recited in claim 1, wherein the multiplexing unit includes:
- a first transmission gate configured to output the first reference signal in response to the internal signal;
- a second transmission gate configured to output the second reference signal in response to the internal signal; and
- an inverter configured to generate an inverted internal signal.

8. The input buffer as recited in claim 1, wherein the differential amplification unit includes:
- a differential amplifier configured to receive an input signal to a positive stage and the first or second reference signal selectively outputted from the multiplexing means to a negative stage; and
- an inverter configured to invert an output of the differential amplifier.

9. The input buffer as recited in claim 8, wherein the differential amplifier is an NMOS bias type.

10. The input buffer as recited in claim 8, wherein the differential amplifier is a PMOS bias type.

11. The input buffer as recited in claim 1, wherein the internal buffer includes a plurality of inverters coupled in series configured to buffer an output signal of the differential amplification unit.

12. The input buffer as recited in claim 1, wherein the reference voltage is an external signal supplied through a specific input pin from an external circuit.

13. The input buffer as recited in claim 1, wherein the reference voltage is an internal signal generated in the semiconductor device.

14. An input buffer of a differential amplification type for buffering an input signal to provide an internal signal in a semiconductor device, comprising:
- a multiplexing unit configured to selectively output a first reference signal having a higher potential level than that of a reference voltage or a second reference signal having a lower potential level than that of the reference voltage in response to the internal signal;
- a differential amplification unit configured to amplify an input signal by comparing the reference signal selectively outputted from the multiplexing means with the input signal; and
- an internal buffer configured to output the internal signal by buffering the amplified input buffer.

15. The input buffer as recited in claim 14, wherein the multiplexing unit outputs the first reference signal if the internal signal is a logic high state and the second reference signal if the internal signal is a logic low state.

16. A method for outputting an internal signal in an input buffer of a differential amplification type for use in a semiconductor device, the method comprising:
- selectively outputting a first reference signal having a potential level higher than that of a reference voltage, or a second reference signal having a potential level higher than that of the reference voltage in response to the internal signal;
- amplifying an input signal by detecting a phase of the input signal by comparing the input signal with the selectively outputted reference signal; and
- buffering and outputting an amplified signal.

17. The method as recited in claim 13, further comprising the step of generating the first reference signal and the second reference signal by using the reference voltage.

* * * * *